United States Patent [19]
Gregorian et al.

[11] Patent Number: 6,121,837
[45] Date of Patent: Sep. 19, 2000

[54] CONSTANT GAIN AMPLIFIER

[75] Inventors: Roubik Gregorian; Saied Rafati, both of Saratoga, Calif.

[73] Assignee: Exar Corporation, Fremont, Calif.

[21] Appl. No.: 09/191,450

[22] Filed: Nov. 12, 1998

[51] Int. Cl.$^7$ ...................................................... H03F 3/45
[52] U.S. Cl. ........................................... 330/253; 330/255
[58] Field of Search ...................................... 330/253, 255, 330/261

[56] References Cited

U.S. PATENT DOCUMENTS 6,005,440  12/1999  Okamoto ............................... 330/255 X

*Primary Examiner*—Steven J. Mottola
*Attorney, Agent, or Firm*—Townsend and Townsend and Crew LLP

[57] ABSTRACT

An operational amplifier that exhibits a relatively constant gain over process and temperature variations. The operational amplifier according to the present invention is designed such that its gain does not depend on process sensitive parameters such as mobility of field effect transistors.

13 Claims, 1 Drawing Sheet

CONSTANT GAIN AMPLIFIER

BACKGROUND OF THE INVENTION

The present invention relates in general to integrated circuits using field effect transistor (FET) technology, and in particular to a CMOS operational amplifier with constant gain.

The gain of a conventional CMOS operation amplifier is determined in part by the ratio of the transconductances of MOS transistors in its input stage. For example, FIG. 1 shows a simplified schematic for a typical input stage of a CMOS operational amplifier. The gain for this stage is approximately equal to the ratio of the transconductance of transistor Q1 (gm1) to the transconductance of transistor Q2 (gm2), or gm1/gm2. The transconductance of an MOS transistor is given by: $\sqrt{\mu C_{ox} I_D (W/L)}$, where, $\mu$ is the mobility of the transistor, Cox is its channel oxide capacitance, $I_D$ is the drain current, and (W/L) is the ratio of the width to length of the channel. The drain current $I_D$ and Cox are the same for both transistors Q1 and Q2. Thus, the gain of this amplifier is determined by the ratio of the mobility of the p-channel transistor Q1 ($\mu_p$) to that of the n-channel transistor Q2 ($\mu_n$), and the ratio of transistor channel sizes. Because the mobility of the MOS transistor changes with process and temperature variations, the gain of the conventional operational amplifier shown in FIG. 1 becomes quite dependent on process and temperature variations. Further, the fact that $\mu_n$ is approximately three times as much as $\mu_p$, adversely affects the gain of the amplifier. To increase the gain of the amplifier, transistor Q1 must be made much larger than transistor Q2 which can be costly in terms of circuit area.

There is a need for efficiently-implemented operational amplifiers that exhibit relatively constant gain over process and temperature variations.

SUMMARY OF THE INVENTION

The present invention provides a CMOS operational amplifier that has a relatively constant gain over process and temperature variations. Broadly, the operational amplifier according to the present invention is designed such that the process-dependent mobility terms ($\mu_p$ and $\mu_n$) cancel each other in the gain calculations. The operational amplifier thus becomes first-order insensitive to process and temperature variations. In one embodiment, the gain of the operational amplifier is enhanced by inserting transistors that steal current away from the load transistors in the input stage of the operational amplifier. Thus, higher gain can be achieved by obtaining a higher ratio of drain currents from the output stage to the input stage.

Accordingly, in one embodiment, the present invention provides an operational amplifier, including an input stage having a pair of input FETs of a first conductivity type coupled to receive a differential input signal, a pair of diode-coupled load FETs of a second conductivity type respectively coupled between a first power supply terminal and drain terminals of the pair of input FETs, and a current-source FET of the first conductivity type coupled between a second power supply terminal and a common-source node between the first pair of input FETs. The operational amplifier further includes a second stage having a driver FET of the second conductivity type with a gate terminal coupled to an output of the input stage, a current-source FET of the first conductivity type coupled between the second power supply terminal and a drain terminal of the driver FET, and a diode-coupled load FET of first conductivity type coupled between the second power supply terminal of the drain terminal of the driver FET.

In another embodiment, the operational amplifier according to the present invention further includes a first current stealing FET of the second conductivity type coupled in parallel to a first one of the pair of diode-coupled load FETs, and a second current stealing FET of the second conductivity type coupled in parallel to a second one of the pair of diode-coupled load FETs.

A better understanding of the nature and advantages of the constant gain CMOS operational amplifier of the present invention may be gained with reference to the detailed description and drawings below.

DESCRIPTION OF THE SPECIFIC EMBODIMENTS

Figure 1:
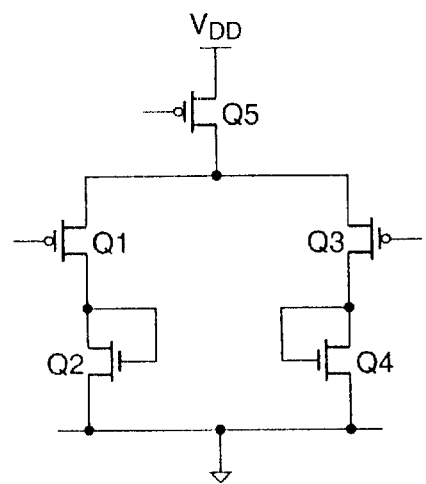
FIG. 1 is a simplified circuit schematic for a typical input stage of a CMOS operational amplifier.
Figure 2:
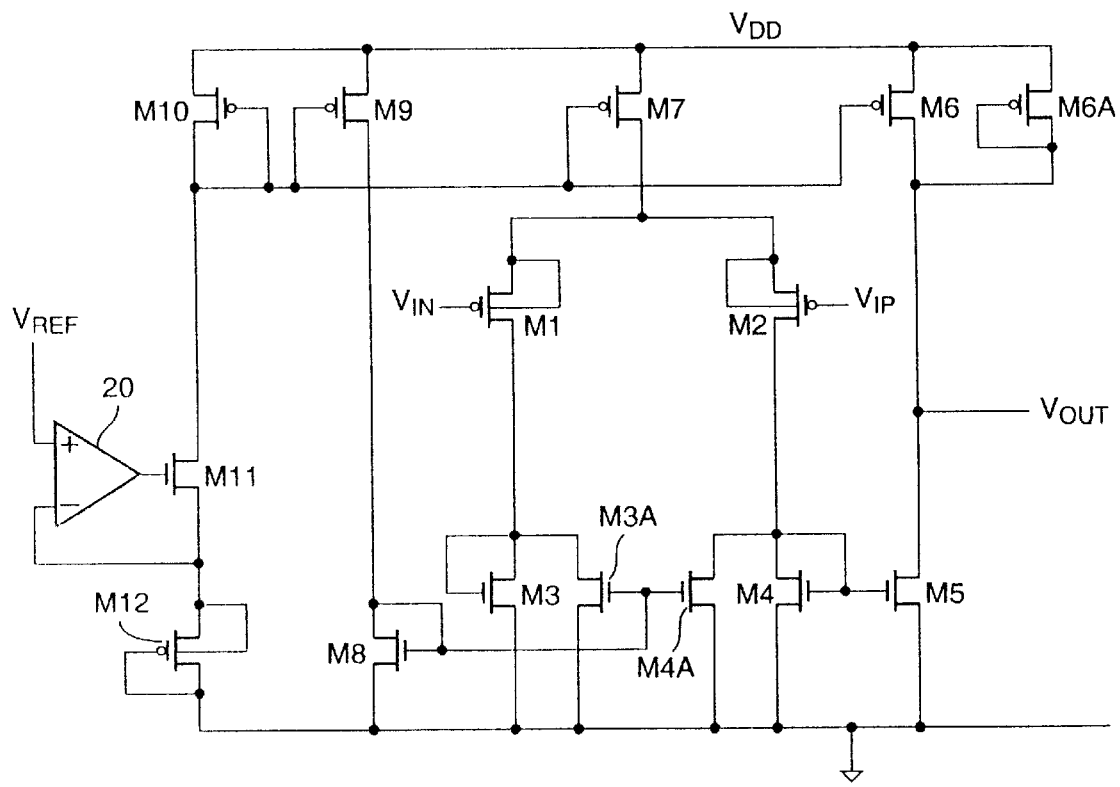
FIG. 2 is a circuit schematic of the CMOS operational amplifier according to the present invention.

Referring to FIG. 2, there is shown a preferred embodiment for the operational amplifier according to the present invention. The operational amplifier includes a differential input stage made up of a pair of p-channel input transistors M1 and M2 that respectively receive input signals VIN and VIP at their gate terminals. A pair of diode-connected n-channel load transistors M3 and M4 connect to the drain terminals of transistors M1 and M2, respectively. P-channel transistor M7 provides the current source for the input stage. The input stage further includes a pair of transistors M3A and M4A that connect in parallel to load transistors M3 and M4, respectively. The second (in this case output) stage includes n-channel transistor M5 whose gate terminal connects to the output of the input stage (common drain node between M2 and M4). A p-channel transistor M6 connects to transistor M5 at output node Vout, and sets the current for the output stage. A second p-channel transistor M6A connects between the output node Vout and the power supply rail VDD. P-channel transistor M6A is diode-connected (i.e., its gate connects to its drain). The operational amplifier further includes a bias network including transistors M8, M9, M10, M11, M12 and buffer 20, that sets up the DC operating condition of the operational amplifier.

In operation, the connection of transistor M6A as shown helps remove the dependence of the amplifier gain on the mobility of the transistors. That is, the impact of the diode-connected output transistor M6A is such that the mobility factors in the gain calculation for the amplifier cancel out. The following analysis shows how the mobility factors are canceled out.

The overall gain G of the amplifier is given by the gain of the input stage G1 times the gain of the second (output) stage G2, i.e., G=G1×G2. The gain of the input stage G1 is approximated by:

$$G1 \sim gm2/gm4 = (\sqrt{\mu_p C_{ox} I_{D2}(W/L)_2})/(\sqrt{\mu_n C_{ox} I_{D4}(W/L)_4}) \quad \text{(Eqn. 1)}$$

Without p-channel transistor M6A, the gain of the output stage G2 would be given by the value of M5's transconductance (gm5) times the effective output impedance at Vout ($r_{o5} \| r_{o6}$). However, the effect of connecting M6A in parallel with M6 is to reduce the gain to the following:

$$G2 \sim gm5/gm6A = (\sqrt{\mu_n C_{ox} I_{D5}(W/L)_5}) / (\sqrt{\mu_p C_{ox} I_{D6A}(W/L)_{6A}}) \quad \text{(Eqn. 2)}$$

Accordingly, the total gain G can be obtained by multiplying the expressions in equations 1 and 2. In the process of multiplication, all of the mobility and Cox terms cancel out, and the resulting gain equals:

$$G \sim G1 \times G2 = (\sqrt{I_{D2}(W/L)_2} / \sqrt{I_{D4}(W/L)_4}) \times (\sqrt{I_{D5}(W/L)_5} / \sqrt{I_{D6A}(W/L)_{6A}}) \quad \text{(Eqn. 3)}$$

As can be appreciated from the above equation, the overall gain of the operational amplifier of the present invention as shown in FIG. 2, is only proportional to the sizes of the transistors, and is thus independent of the process parameters, $\mu_n$ and $\mu_p$. The magnitude of the currents is dictated by the output current requirements and their ratio is determined by the device sizes.

The insertion of p-channel transistor M6A adversely affects the overall gain of the operational amplifier. This is because in the preferred embodiment, the value of (1/gm6A) is significantly smaller than that of ($r_{o5} \| r_{o6}$). To partially compensate for the reduction in the gain of the amplifier, the present invention connects transistors M4A and M3A in parallel with M4 and M3, respectively. Transistors M4A and M3A are biased by the bias network such that each draws a predetermined amount of current away from each leg of the differential input stage. That is, the currents flowing through the drain terminals of input transistors M1 and M2 are now divided between the respective load transistor and the transistor connected in parallel thereto. Thus, current I2=I4+I4A, and similarly, current I1=I3+I3A.

Going back to equation 3, the impact of transistors M3A and M4A stealing current away from each leg of the differential input stage can be noted. With transistor M4A stealing most of transistor M2's current away from transistor M4, the ratio I5/I4 is significantly increased. This in turn, directly increases the overall gain G of the operational amplifier.

The inclusion of buffer 20 in the bias network is optional and is for purposes of establishing a desired dc operating point for the output. The combination of buffer 20 and transistors M10, M11, and M12 operate such that, given an identical current density for transistors for M12 and M6A, the dc value at output Vout is equal to (VDD-Vref). In a preferred embodiment, Vref is equal to ½ VDD. This will establish an optimum dc operating point for Vout in terms of providing the largest voltage margin for all transistors to operate in saturation.

In conclusion, the present invention provides an operational amplifier that exhibits a relatively constant gain over process and temperature variations. The operational amplifier according to the present invention is designed such that its gain does not depend on process sensitive parameters such as the mobility of the field effect transistors. While the above is a complete description of the preferred embodiment of the present invention, it is possible to use various alternatives, modifications and equivalents. For example, the embodiment shown in FIG. 2 uses a p-channel input stage transistors, with an n-channel output driver transistor. An operational amplifier having the same advantages but with n-channel input transistors and p-channel output driver transistor could be implemented using the circuit techniques taught by the present invention. Therefore, the scope of the present invention should be determined not with reference to the above description but should, instead, be determined with reference to the appended claims, along with their full scope of equivalents.

What is claimed is:

1. An operational amplifier implemented using field effect transistor (FET) technology, the operational amplifier comprising:
   an input stage comprising:
      a pair of input FETs of a first conductivity type coupled to receive a differential input signal,
      a pair of load FETs of a second conductivity type respectively coupled between a first power supply terminal and drain terminals of the pair of input FETs, and
      a current-source FET of the first conductivity type coupled between a second power supply terminal and a common-source node of the first pair of input FETs;
   a first current-stealing FET of the second conductivity type coupled in parallel to a first one of the pair of load FETs, and
   a second current stealing FET of the second conductivity type coupled in parallel to a second one of the pair of load FETs; and
   a second stage having a driver FET of the second conductivity type with a gate terminal coupled to an output of the input stage, and a current-source FET of the first conductivity type coupled between the second power supply terminal and a drain terminal of the driver FET.

2. The operational amplifier of claim 1 further comprising a diode-coupled load FET of first conductivity type coupled between the second power supply terminal and the drain terminal of the driver FET.

3. The operational amplifier of claim 2 further comprising a bias network coupled to a gate terminal of the current-source FET in the first stage, a gate terminal of the current-source FET in the second stage, and gate terminals of the first and second current-stealing FETs.

4. The operational amplifier of claim 3 wherein the pair of load FETs are diode-coupled.

5. The operational amplifier of claim 4 wherein the first and second current-stealing FETs steer a substantial portion of a drain current of their respective one of the pair of input FETs away from their respective one of the pair of load FETs.

6. The operational amplifier of claim 5 wherein each FET of the first conductivity type is of a p-channel type, and each FET of the second conductivity type is of an n-channel type.

7. The operational amplifier of claim 3 wherein the bias network comprises:
   a first diode-coupled FET of the first conductivity type coupled between the second power supply and a first node;
   a first FET of the second conductivity type coupled between the first node and a second node;
   a second diode-coupled FET of the first conductivity type coupled between the second node and the first power supply terminal;
   a third diode-coupled FET of the first conductivity type coupled to the first diode-coupled FET and between the second power supply terminal and a third node; and
   a second FET of the second conductivity type coupled between the third node and the first power supply terminal.

8. The operational amplifier of claim 7 wherein the bias network further comprises a unity gain buffer having a first input coupled to a reference signal, a second input coupled to the second node, and an output coupled to a gate terminal of the first FET of the second conductivity type.

9. The operational amplifier of claim 8 wherein a gate terminal of the second FET of the second conductivity type in the bias network couples to the gate terminals of the first and second current-stealing FETs.

10. The operational amplifier of claim 9 wherein the reference signal is substantially equal to one half the power supply voltage applied to the second power supply terminal.

11. The operational amplifier of claim 9 wherein gate terminals of the first and third FETs of the first conductivity type in the bias network couple to the gate terminals of the current-source FETs in the first and second stages.

12. An operational amplifier implemented using field effect transistor (FET) technology, the operational amplifier comprising:

a pair of input FETs of a first conductivity type coupled to receive a differential input signal, a pair of load FETs of a second conductivity type respectively coupled between a first power supply terminal and drain terminals of the pair of input FETs, and a current-source FET of the first conductivity type coupled between a second power supply terminal and a common-source node of the first pair of input FETs;

a second stage having a driver FET of the second conductivity type with a gate terminal coupled to an output of the input stage, a current-source FET of the first conductivity type coupled between the second power supply terminal and a drain terminal of the driver FET, and a diode-coupled load FET of first conductivity type coupled between the second power supply terminal of the drain terminal of the driver FET;

a first current-stealing FET of the second conductivity type coupled in parallel to a first one of the pair of load FETs;

a second current stealing FET of the second conductivity type coupled in parallel to a second one of the pair of load FETs; and a bias network coupled to a gate terminal of the current-source FET in the first stage, a gate terminal of the current-source FET in the second stage, and gate terminals of the first and second current-stealing FETs.

13. An operational amplifier comprising:

a differential input stage having a pair of p-channel input transistors coupled to a pair of n-channel load transistors, and a p-channel current-source transistor;

a single-ended output stage having an n-channel driver transistor coupled to an output of the differential input stage, and a p-channel current-source transistor;

a diode-coupled p-channel transistor coupled in parallel to the p-channel current-source transistor in the output stage;

a pair of current-stealing n-channel transistors respectively coupled in parallel to the pair of load transistors in the differential input stage; and a bias network supplying bias voltages to gate terminals of the p-channel current-source transistors in the input and output stages, and gate terminals of the pair of current-stealing transistors.

\* \* \* \* \*